United States Patent
Chenakin

(10) Patent No.: US 11,817,871 B2
(45) Date of Patent: Nov. 14, 2023

(54) FREQUENCY SYNTHESIZERS HAVING LOW PHASE NOISE

(71) Applicant: Anritsu Company, Morgan Hill, CA (US)

(72) Inventor: Oleksandr Chenakin, Morgan Hill, CA (US)

(73) Assignee: Anritsu Company, Morgan Hill, CA (US)

( * ) Notice: Subject to any disclaimer, the term of this patent is extended or adjusted under 35 U.S.C. 154(b) by 0 days.

(21) Appl. No.: 17/582,320

(22) Filed: Jan. 24, 2022

(65) Prior Publication Data

US 2022/0239301 A1   Jul. 28, 2022

Related U.S. Application Data

(60) Provisional application No. 63/142,924, filed on Jan. 28, 2021, provisional application No. 63/206,163, filed on Feb. 1, 2021.

(51) Int. Cl.
*H03L 7/185* (2006.01)
*H03L 7/087* (2006.01)
(Continued)

(52) U.S. Cl.
CPC .............. *H03L 7/185* (2013.01); *H03B 5/18* (2013.01); *H03L 7/087* (2013.01); *H03L 7/099* (2013.01);
(Continued)

(58) Field of Classification Search
CPC .. H03B 5/18; H03L 7/087; H03L 7/16; H03L 7/18; H03L 7/185; H03L 7/22;
(Continued)

(56) References Cited

U.S. PATENT DOCUMENTS 4,303,893 A * 12/1981 Goldberg ................ H03L 7/185
331/25
4,451,930 A * 5/1984 Chapman ................ H03L 7/183
455/503

(Continued)

FOREIGN PATENT DOCUMENTS

GB          2567463 A  *  4/2019  ............... H03L 7/18

*Primary Examiner* — Levi Gannon
(74) *Attorney, Agent, or Firm* — KILPATRICK TOWNSEND & STOCKTON, LLP

(57) ABSTRACT

Frequency synthesizers having reduced phase noise and a small step size. One example can provide frequency synthesizers having low phase noise by eliminating dividers in a feedback path and instead employing frequency converters, such as mixers. Step size can be further reduced by providing frequency converters in a reference signal feed-forward path. Acquisition time can be decreased by employing a fast-acquisition phase-locked loop that is switched out after acquisition in favor of a low phase-noise phase-locked loop. Another example can reduce phase noise by employing a YIG oscillator. To improve acquisition time, a first, faster phase-locked loop can be used to lock to a signal before switching to a second, slower phase-locked loop that includes the YIG oscillator. Another example can provide low noise by including phase-locked loops that operate in a frequency range having low thermal noise while a frequency of an output signal varies over a wide range.

20 Claims, 10 Drawing Sheets

(51) Int. Cl.
  *H03L 7/099* (2006.01)
  *H03B 5/18* (2006.01)
(52) U.S. Cl.
  CPC ...... *H03L 2207/10* (2013.01); *H03L 2207/12* (2013.01)
(58) Field of Classification Search
  CPC ....... H03L 7/23; H03L 7/235; H03L 2207/10; H03L 2207/12
  See application file for complete search history.

(56) References Cited

U.S. PATENT DOCUMENTS

| | | | |
|---|---|---|---|
| 4,555,678 A | 11/1985 | Galani et al. | |
| 5,032,800 A | 7/1991 | Galani et al. | |
| 5,841,322 A | 11/1998 | Ivanov et al. | |
| 6,005,443 A * | 12/1999 | Damgaard | H03J 5/242 331/25 |
| 6,026,307 A * | 2/2000 | Blom | H03J 5/244 332/127 |
| 6,028,460 A * | 2/2000 | McCollum | H03L 7/183 331/11 |
| 6,150,890 A * | 11/2000 | Damgaard | H03L 7/185 331/25 |
| 6,163,223 A * | 12/2000 | Kapetanic | H03L 7/07 331/25 |
| 7,180,377 B1 * | 2/2007 | Leong | H03L 7/18 331/DIG. 2 |
| 7,701,299 B2 * | 4/2010 | Chenakin | H03L 7/185 331/25 |
| 9,628,066 B1 * | 4/2017 | Chenakin | H03L 7/185 |
| 9,793,904 B1 * | 10/2017 | Chenakin | H03L 7/087 |
| 2014/0320186 A1 * | 10/2014 | Jin | H03L 7/1075 327/159 |
| 2021/0013888 A1 * | 1/2021 | Kim | H03L 7/087 |

* cited by examiner

FREQUENCY SYNTHESIZERS HAVING LOW PHASE NOISE

CROSS-REFERENCE TO RELATED APPLICATIONS

This application claims the benefit of U.S. provisional application No. 63/142,924, filed Jan. 28, 2021, and U.S. provisional application No. 63/206,163, filed Feb. 1, 2021, which are incorporated by reference.

BACKGROUND

Wireless communication has become ubiquitous in daily life. Cell phones, computers, and home networks, as well as a growing array of smart and connected devices, such as speakers, lights, and home appliances, all communicate wirelessly. The wireless communication systems for these devices, as well as for other systems such as radar and data conversion systems, can be tested using signal generation equipment.

Signal generation equipment can include one or more frequency synthesizers. A frequency synthesizer is an electronic system that translates an input reference frequency signal to an output signal at a different frequency. The input reference frequency can be provided by a crystal or other temperature insensitive oscillating device. The output signal can be provided to a circuit or system being tested.

The output signal from a frequency synthesizer can have an amount of phase noise, where the phase noise is a manifestation of instability of the output frequency of the frequency synthesizer and is observed as random frequency fluctuations around the desired output frequency. Phase noise can be a limiting factor in the sensitivity of tests being performed on a system. As a result, it can be desirable to reduce the phase noise of frequency synthesizers in signal generation equipment.

Frequency synthesizers in signal generation equipment can be tuned or adjusted in discrete steps. A decrease in the size of these steps can result in a greater accuracy of the testing being performed with the signal generation equipment.

Thus, what is needed are circuits, methods, and apparatus that can provide frequency synthesizers that have reduced phase noise and a small step size.

SUMMARY

Accordingly, embodiments of the present invention can provide frequency synthesizers having reduced phase noise and a small step size. An illustrative embodiment of the present invention can provide frequency synthesizers having low phase noise. This low phase noise can be achieved by the elimination of dividers in a feedback path and instead employing frequency converters, such as mixers. In these and other embodiments of the present invention, a number of frequency converting elements connected in series can be included in a feedback path. In each element, a mixer can multiply an input signal by a frequency-divided version of the input signal. The frequency-divided version of the input signal can be provided by a divider that is not directly in the frequency conversion path. This can provide tuning for a frequency synthesizer over a large range while maintaining a fine resolution or small step size. These and other embodiments of the present invention can provide even smaller step sizes by including a feedforward path, where the feedforward path includes a number frequency converting elements connected in series.

These and other embodiments of the present invention can provide frequency synthesizers having low phase noise. These frequency synthesizers can provide low noise by including phase-locked loops that operate in a frequency range having low thermal noise. A frequency synthesizer can utilize a variable-multiplier circuit to provide a signal to a feedback path that remains in a high-frequency range while an output signal provided by a voltage-controlled oscillator varies throughout a much wider range.

These and other embodiments of the present invention can provide frequency synthesizers having low phase noise. These frequency synthesizers can provide low phase noise by employing a dual phase-locked loop circuit. A first phase-locked loop having a fast acquisition time can be provided. A second phase-locked loop having low phase noise can be provided in parallel with the first phase-locked loop. The first phase-locked loop can be initially selected to find a lock frequency. As lock is achieved, the low-noise second phase-locked loop can be switched in to replace the fast acquisition first phase-locked loop.

These and other embodiments of the present invention can provide frequency synthesizers having low phase noise. These frequency synthesizers can provide low phase noise by employing a yttrium-iron-garnet (YIG) oscillator. A YIG oscillator can provide a low phase noise oscillator output signal that is highly frequency stable. Given this frequency stability, a YIG oscillator can provide a second phase-locked loop that can consume a long duration acquiring lock. Accordingly, these and other embodiments of the present invention can provide frequency synthesizers that include a first phase-locked loop having a fast acquisition time. This first phase-locked loop can be initially selected to find a lock frequency. As lock is achieved, the YIG oscillator can be tuned to the correct frequency using a digital-to-analog converter or other adjustment circuit. When the YIG oscillator is correctly tuned, the second phase-locked loop can be switched in to replace the first phase-locked loop.

Various embodiments of the present invention can incorporate one or more of these and the other features described herein. A better understanding of the nature and advantages of the present invention can be gained by reference to the following detailed description and the accompanying drawings.

DESCRIPTION OF ILLUSTRATIVE EMBODIMENTS

Figure 1:
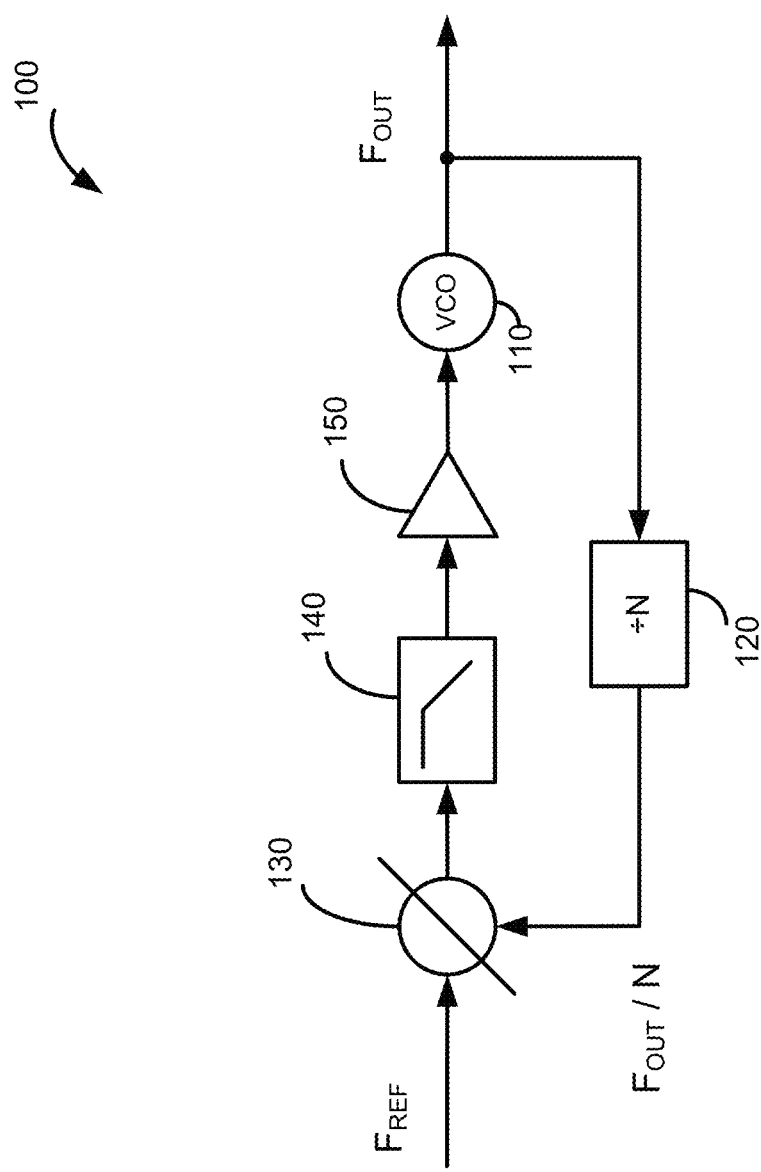
FIG. 1 illustrates a phase-locked loop that can be improved by the incorporation of embodiments of the present invention.

FIG. 1 illustrates a phase-locked loop that can be improved by the incorporation of embodiments of the present invention. Phase-locked loop 100 can be used as a frequency synthesizer. Alternatively, phase-locked loop 100 can be included as a portion of a frequency synthesizer, along with other signal processing circuits, reference signal generators, and other components or circuits.

Phase-locked loop 100 can include voltage-controlled oscillator 110. Voltage-controlled oscillator 110, similar to the other voltage-controlled oscillators shown herein, can include a tank circuit formed of an inductor and a capacitor (not shown.) Alternatively, voltage-controlled oscillator 110 can be a ring oscillator formed of a number of circuits having a net inversion and connected in a loop, or voltage-controlled oscillator 110 can have a different topology or circuit configuration. Voltage-controlled oscillator 110 can provide an output signal having a frequency $F_{OUT}$.

Phase-locked loop 100 can include a feedforward path. This feedforward path can provide a reference signal having a frequency $F_{REF}$ to a first input of phase detector 130. Various low phase noise signal sources can be used to provide the reference signal. For example, a crystal, digital-signal generator, oscillator, or other circuit or component can be used to generate the reference signal.

Phase-locked loop 100 can include a feedback path from an output of the voltage-controlled oscillator 110 to a second input of phase detector 130. The feedback path can include a divider 120. Divider 120 can divide a frequency of the output signal out by an integer, represented here as the value N. The output of phase detector 130 can be filtered by lowpass filter 140. The output signal from lowpass filter 140 can be amplified by amplifier 150 and provided as a frequency control input to voltage-controlled oscillator 110. Phase-locked loop 100 can provide an output signal having a frequency $F_{OUT}$ that is N times the frequency $F_{REF}$ of the reference signal.

Divider 120 in the feedback path of phase-locked loop 100 can generate an unacceptable level of phase noise for certain frequency synthesizer applications. Frequency synthesizer phase noise within the loop filter bandwidth can be given by: L=LPD+20 log N, where LPD is the cumulative phase noise of the reference signal, phase detector 130, divider 120, lowpass filter 140 and amplifier 150, referred to the input of phase detector 130, and N is the division ratio of divider 120. In practice, the frequency synthesizer phase noise performance can be limited by large division ratios required to provide a high frequency output while maintaining a fine resolution or small step size. For example, to obtain 1 MHz frequency resolution at a 10 GHz output, the feedback divider ratio N for divider 120 can be 10,000, corresponding to an 80 dB phase noise degradation.

Also, when the divider ratio for divider 120 is an integer, the smallest frequency step size by which the output signal frequency $F_{OUT}$ can be varied is equal to the frequency $F_{REF}$ of the reference signal. As a result, the need for a small step size or fine resolution can require a large divider ratio, leading to increased phase noise.

Accordingly, these and other embodiments of the present invention can provide frequency synthesizers that can reduce or eliminate the need for a divider in a feedback path, and these and other embodiments of the present invention can provide frequency synthesizers that can eliminate the need for a divider directly in a feedback path. These and other embodiments of the present invention can provide frequency synthesizers having small frequency step sizes. An example is shown in the following figure.

Figure 2:
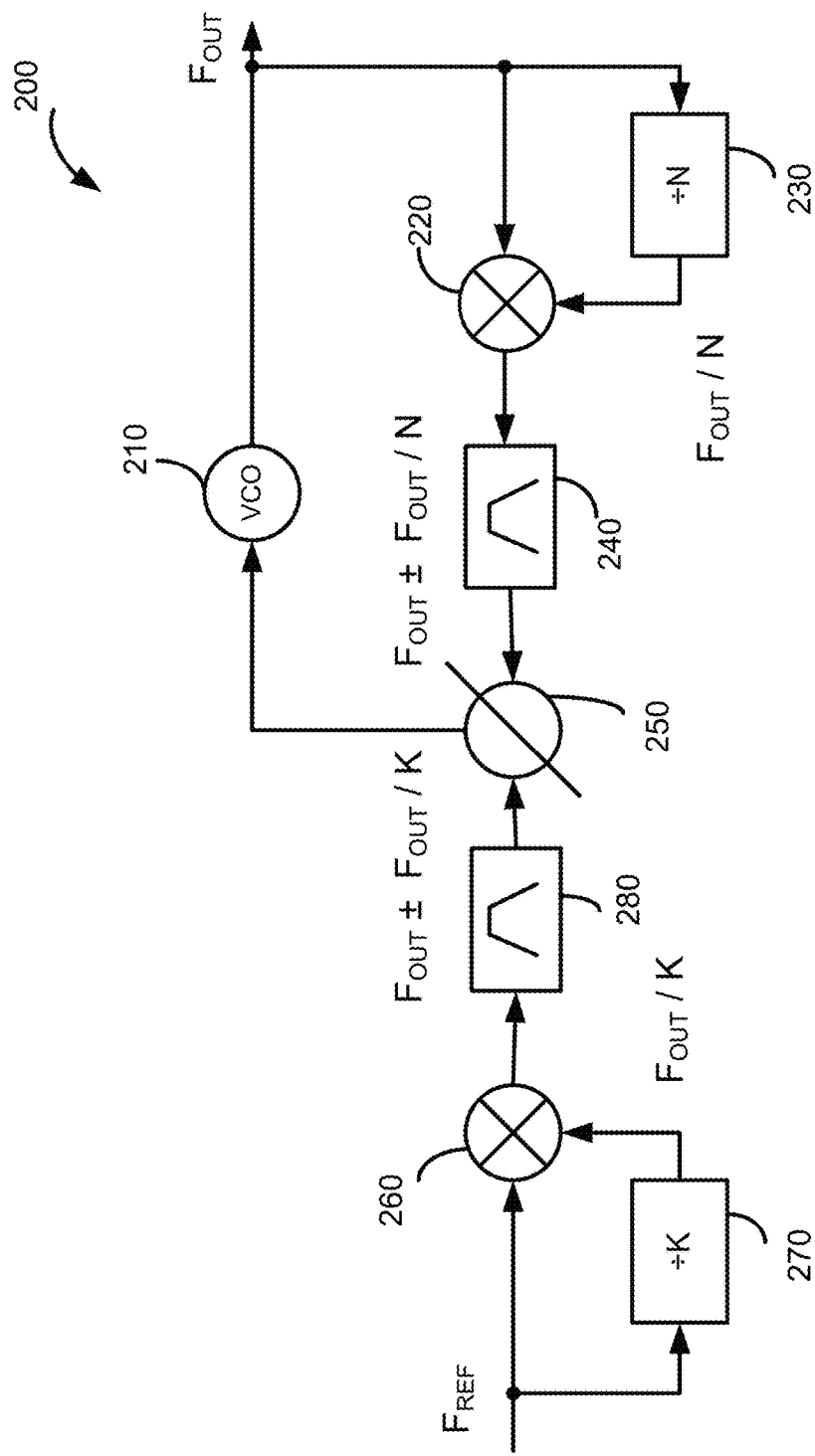
FIG. 2 illustrates a frequency synthesizer according to an embodiment of the present invention.

FIG. 2 illustrates a frequency synthesizer according to an embodiment of the present invention. Voltage-controlled oscillator 210 can provide an output signal having a frequency $F_{OUT}$. In this example, a feedback path can include mixer 220 and bandpass filter 240. Mixer 220 can be used as a frequency converter, thereby removing a divider in the feedback path, such as divider 120 (shown in FIG. 1.) The amount of frequency conversion provided by mixer 220 can be determined by the divider ratio of divider 230. That is, mixer 220 can provide sideband components that are spaced from the frequency $F_{OUT}$ by $F_{OUT}/N$. Bandpass filter 240 can be tuned or designed to pass one of these sideband components while rejecting the other.

It should be noted that divider 230 is not directly in the feedback path for frequency synthesizer 200. Instead, divider 230 can determine an amount of frequency translation provided by mixer 220. The combination of mixer 220 and divider 230, and the similar combinations shown herein, can be referred to as a frequency conversion element, or more simply, an element. Mixer 220, and the other mixers shown herein, can be referred to as a modulator, upconverter, downconverter, multiplier, or other term. Mixer 220 can be implemented using diode rings, Gilbert gain cells, multipliers, or other appropriate circuits. An element can be implemented as a mixer and a divider as shown, though in these and other embodiments of the present invention, an element can be implemented using a harmonic mixer or other appropriate circuit.

Frequency synthesizer 200 can further include a feedforward path. This feedforward path can receive a reference signal having a frequency $F_{REF}$. In these and other embodiments of the present invention, various low phase noise signal sources can be used to provide the reference signal. For example, a crystal, digital-signal generator, oscillator, or other circuit or component can be used to generate the reference signal. The reference signal can be frequency converted by an element including mixer 260 and divider 270. That is, the amount of frequency conversion provided by mixer 260 can be determined by the divider ratio of divider 270. Mixer 260 can provide sideband components that are spaced from the frequency $F_{OUT}$ by $F_{OUT}/N$. Bandpass filter 280 can be tuned to pass one of these sideband components while rejecting the other.

The output of bandpass filter 280 can be received at a first input of phase detector 250, while the output of bandpass filter 240 can be received at a second input of phase detector 250. An output of phase detector 250 can be received at a control input of voltage-controlled oscillator 210. Other components, such as a lowpass filter 540 and amplifier 542 (shown in FIG. 5) can be used to filter and amplify the output of phase detector 250 before being received by the control input of voltage-controlled oscillator 210.

Phase detector 250 can provide an output control signal to voltage-controlled oscillator 210 such that the frequencies of the signals received by phase detector 250 are equal. From this, it can be determined that:

$$F_{OUT} = F_{REF} * N(K \pm 1)/K(N \pm 1) \qquad \text{Eq. 1}$$

N and K can have integer or fractional values. Since N and K can be varied independently, the minimum step size can be a fraction of the frequency $F_{REF}$ of the reference signal. Accordingly, this and the other frequency synthesizers shown here can be referred to as fractional-N frequency synthesizers.

It should be noted that divider 270 is not directly in the feedforward path for frequency synthesizer 200. Instead, divider 270 determines an amount of frequency translation or conversion provided by mixer 260. By employing this frequency translation or conversion instead of the frequency division utilized in FIG. 1, the phase noise of the output signal $F_{OUT}$ can be reduced. Also, when the divide ratio N of divider 230 and the divide ratio K of divider 270 are programmable, the frequency $F_{OUT}$ of the output signal provided by voltage-controlled oscillator 210 can be tuned or adjusted with a fine resolution or very small step size that can be smaller than the frequency $F_{REF}$ of the reference signal. These step sizes can be further reduced by including additional frequency conversion elements to either or both the feedforward and feedback paths. An example is shown in the following figure.

Figure 3:
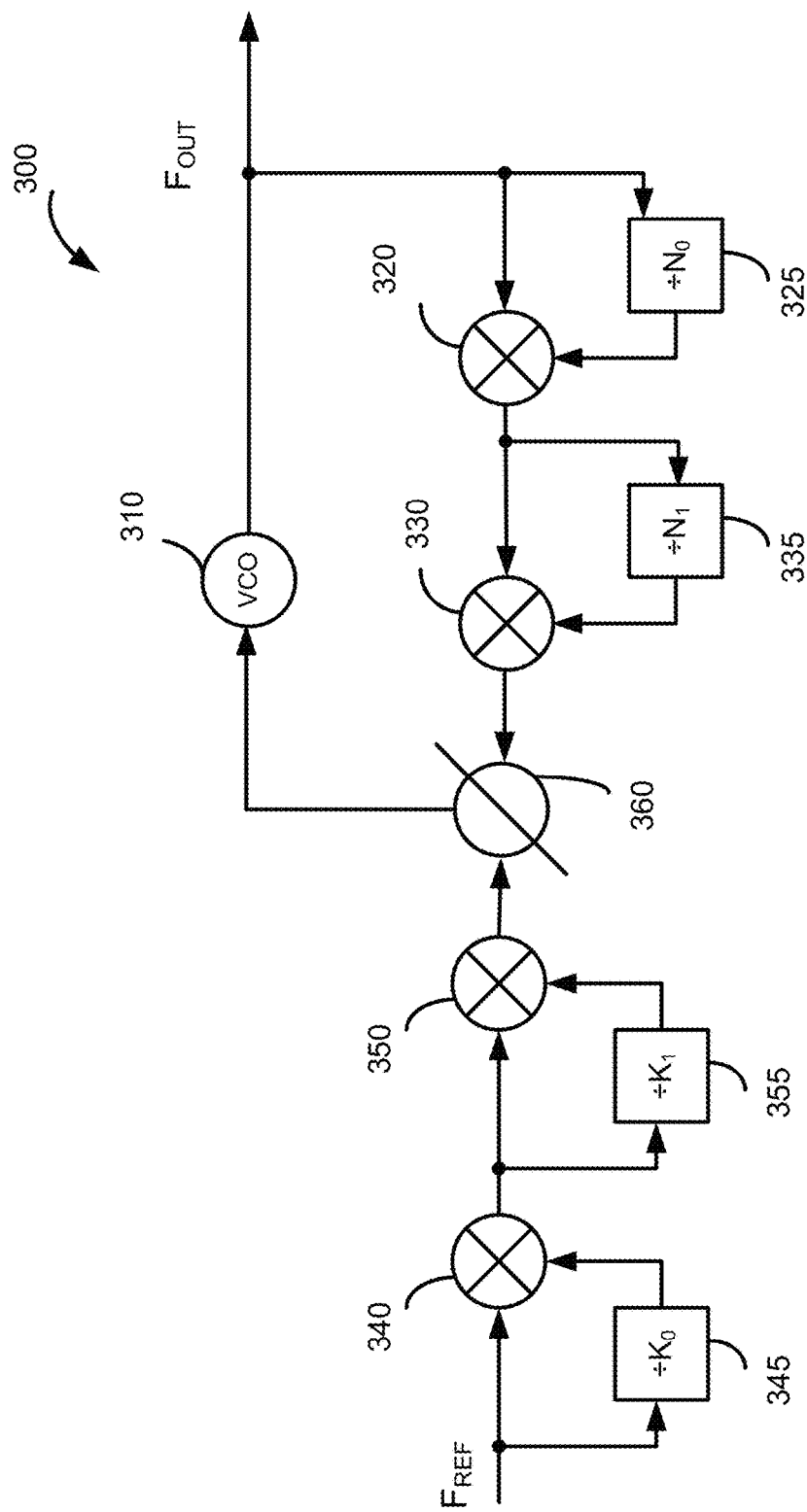
FIG. 3 illustrates a frequency synthesizer according to an embodiment of the present invention.

FIG. 3 illustrates a frequency synthesizer according to an embodiment of the present invention. Frequency synthesizer 300 can include voltage-controlled oscillator 310 that provides an output signal having a frequency $F_{OUT}$. In this example, two frequency conversion elements are shown in the feedback path, though in these or other embodiments of the present invention, three, five, 10 or more frequency conversion elements can be included in the feedback path. In this example, frequency synthesizer 300 can include mixer 320 and mixer 330 in the feedback path. The frequency conversion provided by mixer 320 and mixer 330 can be determined by dividers 325 and 335, respectively.

Frequency synthesizer 300 can further include a feedforward path that includes one, two, or more than two frequency conversion elements. In this example, two frequency conversion elements are shown, though in these or other embodiments of the present invention, three, five, 10 or more frequency conversion elements can be included in the feedforward path. In this example, the feedforward path can include mixer 340 and mixer 350. The frequency conversion provided by mixer 340 and mixer 350 can be determined by dividers 345 and 355, respectively.

The output of the feedforward path can be received at a first input of phase detector 360. An output of the feedback path can be received at a second input of phase detector 360. An output of a phase detector 360 can provide a control input to voltage-controlled oscillator 310. Other circuits, such as the lowpass filter 540 and amplifier 542 (shown in FIG. 5) can be used to filter and amplify the output of phase detector 360 being received at a control input of voltage-controlled oscillator 310.

In this example, bandpass filters can be located at the outputs of mixer 350 and mixer 330, similar to the bandpass filter 280 and bandpass filter 240 (shown in FIG. 2.) In these and other embodiments of the present invention, bandpass filters can be located at outputs of mixer 340 and mixer 320. In these and the other figures shown herein, one or more bandpass filters at these and similar locations can be omitted for clarity.

In this configuration, the frequency conversion of the reference signal frequency $F_{REF}$ can be controlled by adjusting divider ratio $K_0$ for divider 345 and divider ratio $K_1$ for divider 355. The frequency conversion of the output signal frequency $F_{OUT}$ can be controlled by adjusting divider ratio $N_0$ for divider 325 and divider ratio Ni for divider 335. By varying these four values, a minimum step size for the frequency $F_{OUT}$ of the output signal of voltage-controlled oscillator 310 can be adjusted to have a small value. Also, the minimum step size can be adjusted over a wide range.

These and other embodiments of the present invention can be implemented to improve either or both phase noise and step size. An example is shown in the following figure.

Figure 4:
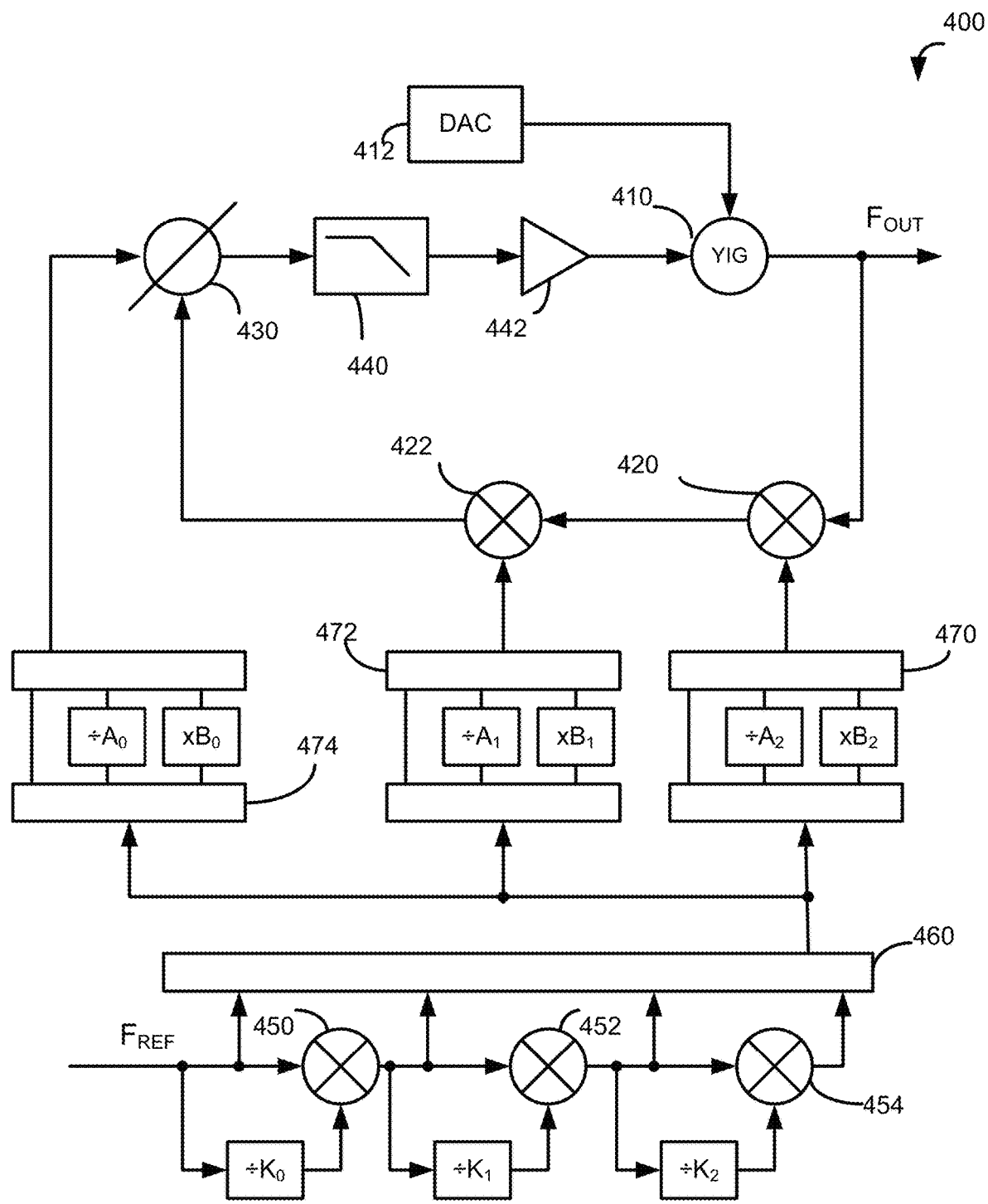
FIG. 4 illustrates a frequency synthesizer according to an embodiment of the present invention.

FIG. 4 illustrates a frequency synthesizer according to an embodiment of the present invention. In frequency synthesizer 400, a yttrium-iron-garnet (YIG) oscillator 410 can be employed. YIG oscillator 410 can include a YIG crystal that can be tuned using one or more inductors acting as electromagnets. The YIG crystal can have a very high Q and can oscillate at a very stable frequency with low phase noise. YIG oscillator 410 can provide an output signal having a frequency $F_{OUT}$ to a feedback path. The feedback path can include mixer 420 and mixer 422.

Frequency synthesizer 400 can include a feedforward path including a number of frequency conversion elements. This feedforward path can receive a reference signal having a frequency $F_{REF}$. The reference signal can be provided by a crystal, digital-signal generator, oscillator, or other circuit or component. In this example, three serially-connected frequency conversion elements 450, 452, and 454 are shown, though in these and other embodiments of the present invention, one, two, four, or more serially-connected frequency conversion elements can be employed. Multiplexer 460 can receive two or more of the reference signal or outputs of elements 450, 452, and 454. Alternatively, multiplexer 460 can be omitted and an output of a final element in the series of elements can be utilized.

The output of multiplexer 460, or the output of a final element in the series of elements when multiplexer 460 is not used, can be received by multiply-and-divide circuits 470, 472, and 474. The multiply-and-divide circuits 470, 472, and 474 can selectively provide a unity gain, a frequency division, or a frequency multiplication. These and the other frequency multipliers shown herein can be implemented using comb generators, comb filters, frequency doublers, or other circuits. In this example, three multiply-and-divide circuits are shown, though in these and other embodiments of the present invention, one, two, four, or more multiply-and-divide circuits can be utilized.

Each multiply-and-divide circuit 470, 472, and 474, can selectively provide its input signal, a frequency-divided version of its input signal, or a frequency-multiplied version of its input signal, as an output. The output of multiply-and-divide circuit 470 can be used to determine a frequency conversion of mixer 420 in the feedback path of frequency synthesizer 400. The output of multiply-and-divide circuit 472 can be used to determine a frequency conversion of mixer 422 in the feedback path of frequency synthesizer 400. While two mixers are shown in the feedback path in this example, three, four, or more than four mixers can be used, and each mixer can receive an input from a corresponding multiply-and-divide circuit. The output of multiply-and-divide circuit 474 can be received at a first input of phase detector 430. An output of the feedback path can be received at a second input of phase detector 430. The output of phase detector 430 can be lowpass filtered using lowpass filter 440 and amplified using amplifier 442. The output of amplifier 442 can be received by a tuning coil of a low inductance tuning coil of YIG oscillator 410. This low inductance tuning coil of the YIG oscillator 410 can provide a fine tuning for the frequency $F_{OUT}$ of the output signal. Digital-to-analog converter (DAC) 412 can be set to provide a current in a high inductance main coil of YIG oscillator 410. Current from DAC 412 provided to the high inductance main coil of YIG oscillator 410 can provide a coarse tuning.

In frequency synthesizer 400, the frequency conversion provided by element 450, element 452, and element 454, can be adjusted by changing the divide ratios $K_0$, $K_1$, and $K_2$, respectively. The frequency conversion provided by the feedback path in frequency synthesizer 400 can be further adjusted by selecting from among the unity, divide, and multiply paths of multiply-and-divide circuits 470 and 472. Further adjustment can be made by adjusting the divide ratios $A_2$ and $A_1$ or multiply ratios $B_2$ and $B_1$ in each of the multiply-and-divide circuits 470 and 472, respectively. The frequency of the comparison signal received at the first input of phase detector 430 can be further adjusted by selecting from among the unity, divide, multiply paths of multiply-and-divide circuit 474. Further adjustments can be made by adjusting the divide ratio $A_0$ or multiply ratio $B_0$ in multiply-and-divide circuit 474. Frequency synthesizer 400 can include other circuits. For example, bandpass or other filters can be utilized at one or more outputs of mixer 420, mixer 422, element 450, element 452, element 454, or other locations to suppress one or more unwanted sidebands or other frequency components.

Components in frequency synthesizers can have an inherent thermal noise. This thermal noise can be higher at low frequencies and can decrease at higher frequencies. The higher level of thermal noise at low frequencies can cause excessive phase noise for frequency synthesizers operating in these low-frequency regions. Accordingly, embodiments of the present invention can provide frequency synthesizers having circuitry that operates in a narrow range of high frequencies while providing an output signal that can vary over a larger range of frequencies. An example is shown in the following figure.

Figure 5:
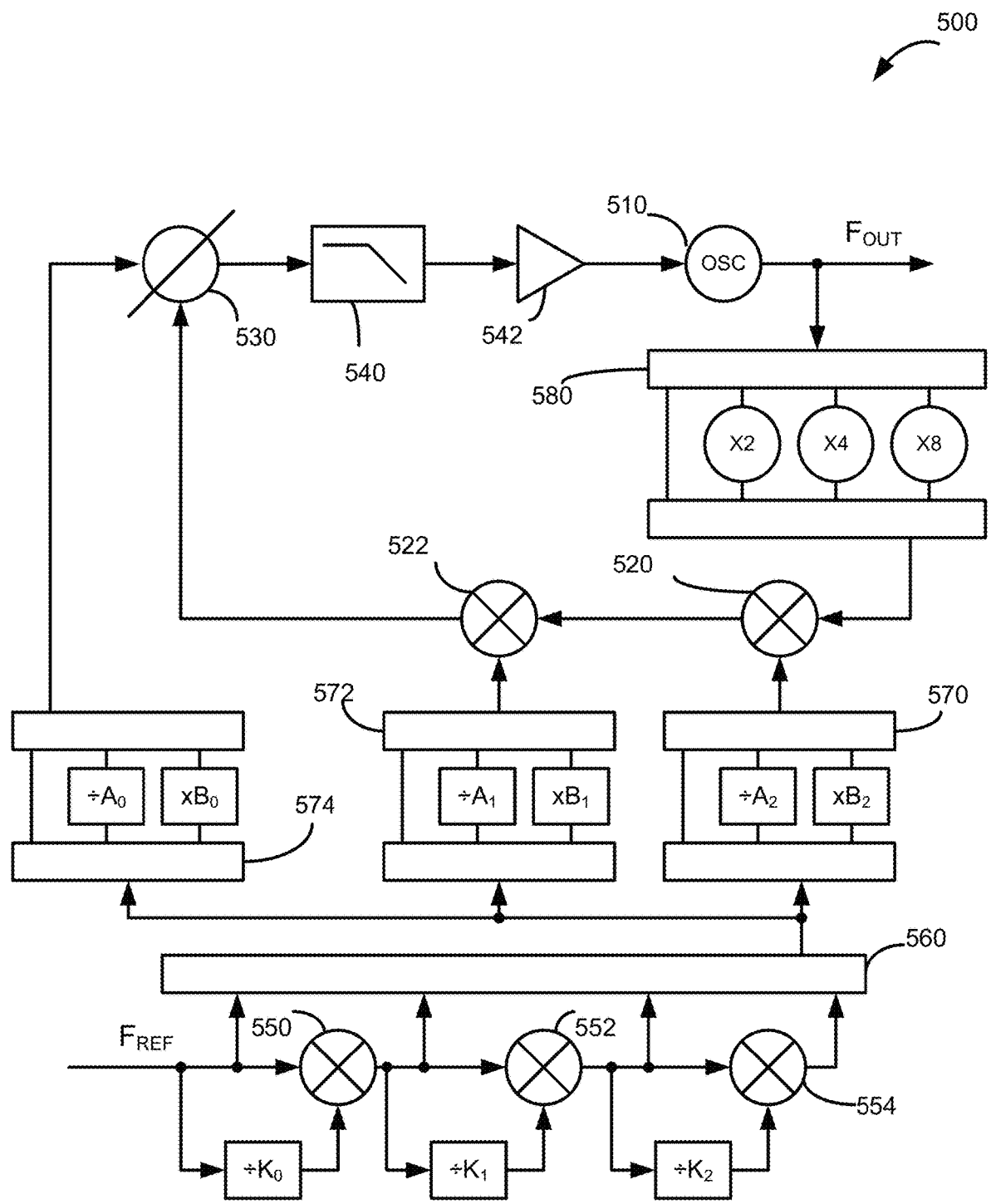
FIG. 5 illustrates a frequency synthesizer according to an embodiment of the present invention.

FIG. 5 illustrates a frequency synthesizer according to an embodiment of the present invention. Frequency synthesizer 500 can utilize variable-multiplier circuit 580 to provide a signal to a feedback path that remains in a high-frequency range while the output signal varies throughout a much wider range. As an example, it can be desirable to provide a range of output frequencies $F_{OUT}$ between 2 and 20 GHz. It can also be desirable to maintain operation of the feedback path at a frequency between 10 and 20 GHz to limit the effect of thermal noise.

Accordingly, frequency synthesizer 500 can employ variable-multiplier circuit 580. Variable-multiplier circuit 580 can receive the voltage-controlled oscillator output signal having a frequency $F_{OUT}$ and can provide one of the output signal or the output signal frequency-multiplied by one or more factors. In this example, variable-multiplier circuit 580 can provide one of the output signal frequency multiplied by factors of unity, two (×2), four (×4), and eight (×8) to mixer 520 in the feedback path. In these and other embodiments of the present invention, other multiplication and division factors can be included in variable-multiplier circuit 580. When these values are multiples of two, they can be implemented using one or more frequency doublers connected in series. Alternatively, other circuits, such a comb generators, can be used, and they can provide multiplication factors that are not limited to powers of two. Variable-multiplier circuit 580 can receive the output signal and increase its frequency to a higher range. For example, when $F_{OUT}$ is between 10 and 20 GHz, the output signal can be provided directly using the unity path through variable-multiplier circuit 580 to the feedback path including mixers 520 and 522. When $F_{OUT}$ is between 5 and 10 GHz, the frequency $F_{OUT}$ can be doubled using the X2 path, such that the frequency of the signal provided to mixer 520 remains in the 10 to 20 GHz range. When $F_{OUT}$ is between 2.5 and 5 GHz, the output signal having the frequency $F_{OUT}$ can be provided through the X4 path, such that the frequency of the signal provided to mixer 520 once again remains in the 10 to 20 GHz range. When $F_{OUT}$ is in between 2 and 2.5 GHz, the output signal having the frequency $F_{OUT}$ can be provided through the X8 path, such that the frequency of the signal provided to mixer 520 remains in the 16 to 20 GHz range. In this way, an output signal from voltage-controlled oscillator 510 can be varied over a range from 2 to 20 GHz, while the feedback path including mixer 520 receives a signal having a frequency between 10 and 20 GHz. This can help to reduce thermal noise in the feedback path and other circuits of frequency synthesizer 500.

Frequency synthesizer 500 can include a feedforward path including a number of frequency conversion elements. This feedforward path can receive a reference signal having a frequency $F_{REF}$. The reference signal can be provided by a crystal, digital-signal generator, oscillator, or other circuit or component. In this example, three serially-connected frequency conversion elements 550, 552, and 554 are shown, though in these and other embodiments of the present invention, one, two, four, or more serially-connected frequency conversion elements can be employed. Multiplexer 560 can receive two or more of the reference signal or outputs of elements 550, 552, and 554. Alternatively, multiplexer 560 can be omitted and an output of a final element in the series of elements can be utilized.

The output of multiplexer 560, or the output of a final element in the series of elements when multiplexer 560 is not used, can be received by multiply-and-divide circuits 570, 572, and 574. In this example, three multiply-and-divide circuits are shown, though in these and other embodiments of the present invention, one, two, four, or more multiply-and-divide circuits can be utilized.

Each multiply-and-divide circuit 570, 572, and 574, can selectively provide its input signal, a frequency-divided version of its input signal, or a frequency-multiplied version of its input signal, as an output. The output of multiply-and-divide circuit 570 can be used to determine a frequency conversion of mixer 520 in the feedback path of frequency synthesizer 500. The output of multiply-and-divide circuit 572 can be used to determine a frequency conversion of mixer 522 in the feedback path of frequency synthesizer 500. While two mixers are shown in the feedback path in this example, three, four, or more than four mixers can be used, and each mixer can receive an input from a corresponding multiply-and-divide circuit. The output of multiply-and-divide circuit 574 can be received at a first input of phase detector 530. An output of the feedback path can be received at a second input of phase detector 530. The output of phase detector 530 can be lowpass filtered using lowpass filter 540 and amplified using amplifier 542. The output of amplifier 542 can be received at a control input of voltage-controlled oscillator 510.

In frequency synthesizer 500, the frequency conversion provided by element 550, element 552, and element 554, can be adjusted by changing the divide ratios $K_0$, $K_1$, and $K_2$, respectively. The frequency conversion provided by the feedback path in frequency synthesizer 500 can be further adjusted by selecting from among the unity, divide, and multiply paths of multiply-and-divide circuits 570 and 572. Further adjustment can be made by adjusting the divide ratios $A_2$ and $A_1$ or multiply ratios $B_2$ and $B_1$ in each of the multiply-and-divide circuits 570 and 572, respectively. The frequency of the comparison signal received at the first input of phase detector 530 can be further adjusted by selecting from among the unity, divide, multiply paths of multiplyand-divide circuit 574. Further adjustments can be made by adjusting the divide ratio $A_0$ or multiply ratio $B_0$ in multiply-and-divide circuit 574. Frequency synthesizer 500 can include other circuits. For example, bandpass or other filters can be utilized at one or more outputs of mixer 520, mixer 522, element 550, element 552, element 554, or other locations to suppress one or more unwanted sidebands or other frequency components.

In these and other embodiments of the present invention, a low phase noise oscillator, such as YIG oscillator 410 (shown in FIG. 4), can be included in a circuit that employs a variable-multiplier circuit, such as the variable-multiplier circuit 580. An example is shown in the following figure.

Figure 6:
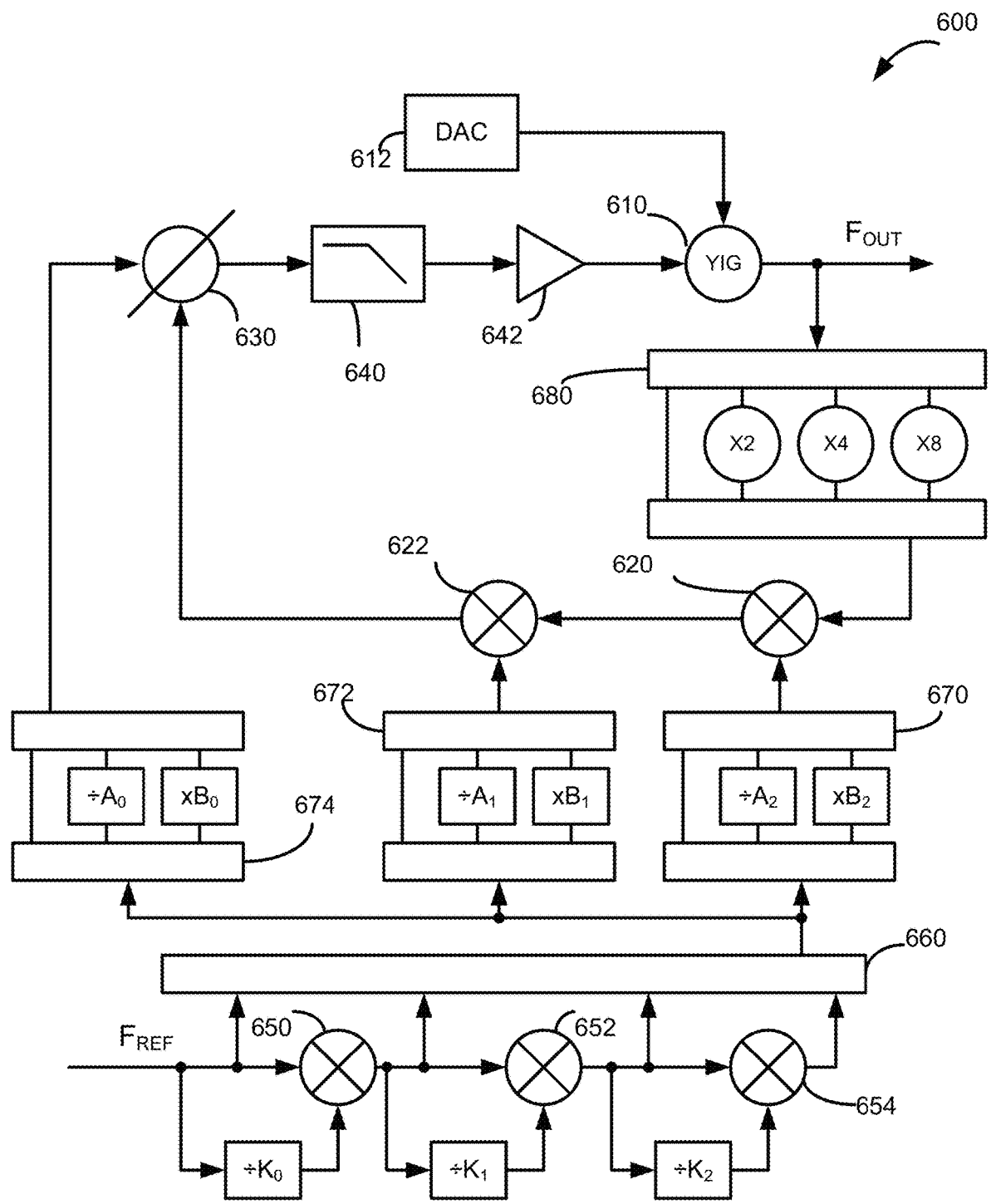
FIG. 6 illustrates a frequency synthesizer according to an embodiment of the present invention.

FIG. 6 illustrates a frequency synthesizer according to an embodiment of the present invention. In frequency synthesizer 600, a YIG oscillator 610 can be employed. YIG oscillator 610 can include a YIG crystal that can be tuned using one or more inductors acting as electromagnets. The YIG crystal can have a very high Q and can oscillate at a very stable frequency having low phase noise. YIG oscillator 610 can provide an output signal having a frequency $F_{OUT}$ to a feedback path that includes variable-multiplier circuit 680.

Similar to frequency synthesizer 500, frequency synthesizer 600 can utilize variable-multiplier circuit 680 to provide a signal to a feedback path that remains in a high-frequency range while the output signal from the voltage-controlled oscillator varies throughout a much wider range. Variable-multiplier circuit 680 can receive the voltage-controlled oscillator output signal having a frequency $F_{OUT}$ and provide one of the output signal or the output signal frequency-multiplied by one or more factors. Variable-multiplier circuit 680 can receive the output signal from the YIG oscillator 610 and increase its frequency $F_{OUT}$ to a higher range when necessary using one of the X2, X4, and X8 paths through variable-multiplier circuit 680. In one example, an output signal from YIG oscillator 610 can be varied over a range from 2 to 20 GHz, while the feedback path including mixer 620 can receive a signal having a frequency between 10 and 20 GHz. This can help to reduce thermal noise in the feedback path of frequency synthesizer 600.

Frequency synthesizer 600 can include a feedforward path including a number of frequency conversion elements. This feedforward path can receive a reference signal having a frequency $F_{REF}$. The reference signal can be provided by a crystal, digital-signal generator, oscillator, or other circuit or component. In this example, three serially-connected frequency-conversion elements 650, 652, and 654 are shown, though in these and other embodiments of the present invention, one, two, four, or more serially-connected frequency-conversion elements can be employed. Multiplexer 660 can receive two or more of the reference signal or outputs of elements 650, 652, and 654. Alternatively, multiplexer 660 can be omitted and an output of a final element in the series of elements can be utilized.

The output of multiplexer 660, or the output of a final element in the series of elements when multiplexer 660 is not used, can be received by multiply-and-divide circuits 670, 672, and 674. In this example, three multiply-and-divide circuits are shown, though in these and other embodiments of the present invention, one, two, four, or more multiply-and-divide circuits can be utilized.

Each multiply-and-divide circuit 670, 672, and 674, can selectively provide its input signal, a frequency-divided version of its input signal, or a frequency-multiplied version of its input signal, as an output. The output of multiply-and-divide circuit 670 can be used to determine a frequency conversion of mixer 620 in the feedback path of frequency synthesizer 600. The output of multiply-and-divide circuit 672 can be used to determine a frequency conversion of mixer 622 in the feedback path of frequency synthesizer 600. While two mixers are shown in the feedback path in this example, three, four, or more than four mixers can be used, and each mixer can receive an input from a corresponding multiply-and-divide circuit. The output of multiply-and-divide circuit 674 can be received at a first input of phase detector 630. An output of the feedback path can be received at a second input of phase detector 630. The output of phase detector 630 can be lowpass filtered using lowpass filter 640 and amplified using amplifier 642. The output of amplifier 642 can be received by a tuning coil of a low inductance tuning coil of YIG oscillator 610. This low inductance tuning coil of YIG oscillator 610 can provide a fine tuning for the frequency $F_{OUT}$ of the output signal. DAC 612 can be set to provide a current in a high inductance main coil of YIG oscillator 610. Current provided by DAC 612 to the high inductance main coil of YIG oscillator 610 can provide a coarse tuning.

In frequency synthesizer 600, the frequency conversion provided by element 650, element 652, and element 654, can be adjusted by changing the divide ratios $K_0$, $K_1$, and $K_2$, respectively. The frequency conversion provided by the feedback path in frequency synthesizer 600 can be further adjusted by selecting from among the unity, divide, and multiply paths of multiply-and-divide circuits 670 and 672. Further adjustment can be made by adjusting the divide ratios $A_2$ and $A_1$ or multiply ratios $B_2$ and $B_1$ in each of the multiply-and-divide circuits 670 and 672, respectively. The frequency of the comparison signal received at the first input of phase detector 630 can be further adjusted by selecting from among the unity, divide, multiply paths of multiply-and-divide circuit 674. Further adjustments can be made by adjusting the divide ratio $A_0$ or multiply ratio $B_0$ in multiply-and-divide circuit 674. Frequency synthesizer 600 can include other circuits. For example, bandpass or other filters can be utilized at one or more outputs of mixer 620, mixer 622, element 650, element 652, element 654, or other locations to suppress one or more unwanted sidebands or other frequency components.

While the above examples can provide a stable low noise output signal, acquisition of a lock at the phase detector can be time-consuming. Accordingly, embodiments of the present invention can include circuits, methods, and apparatus, for more quickly achieving a lock. In these examples, a first loop having a large amount of phase noise can be used to quickly acquire frequency lock. Once frequency lock is achieved, output signal generation can be handed off to a second loop having lower phase noise. An example is shown in the following figure.

Figure 7:
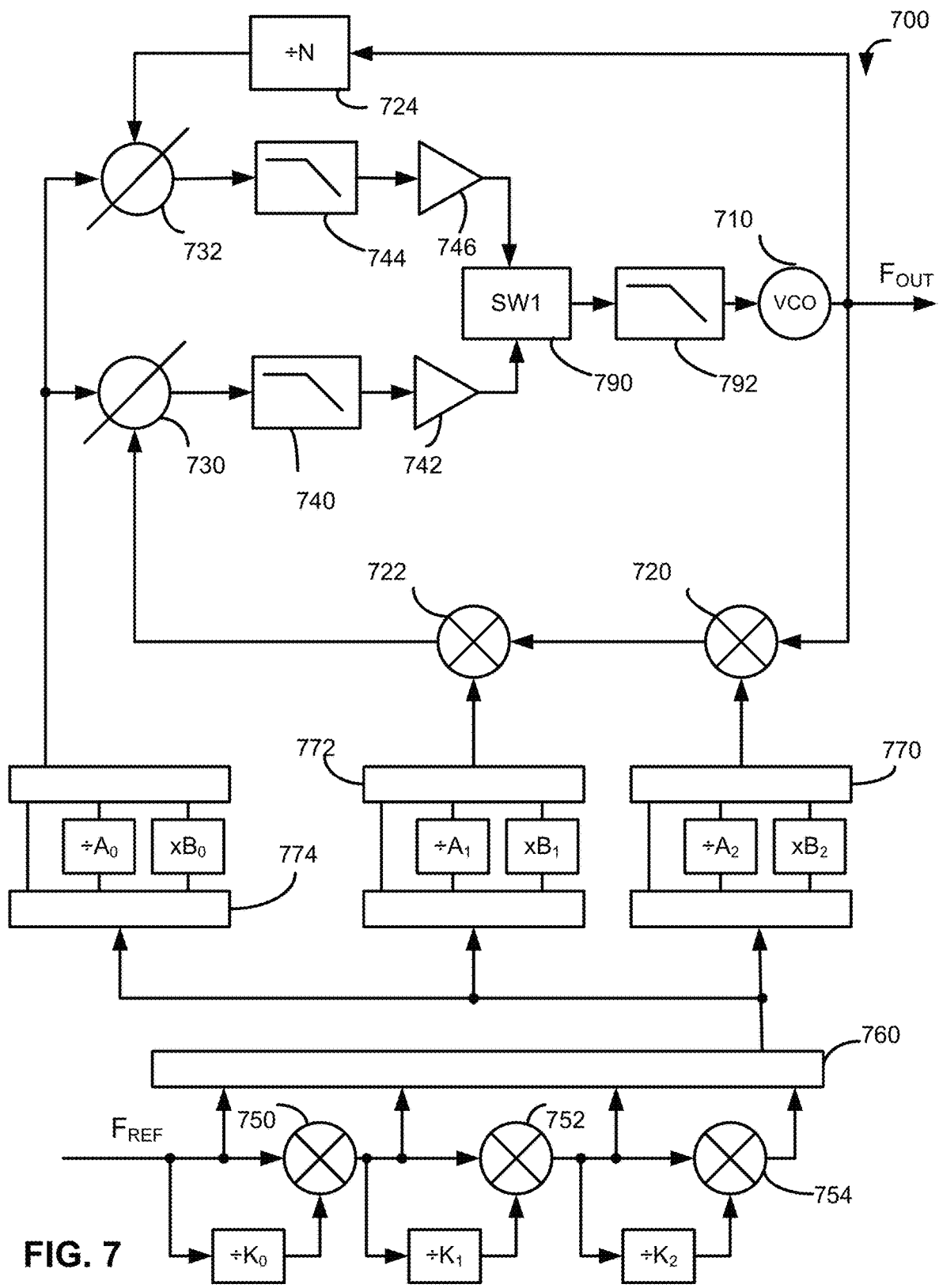
FIG. 7 illustrates a frequency synthesizer according to an embodiment of the present invention.

FIG. 7 illustrates a frequency synthesizer according to an embodiment of the present invention. Frequency synthesizer 700 can include a dual-loop configuration where a first loop includes first phase detector 732 and divider 724, and a second loop includes second phase detector 730 and mixers 720 and 722. The first loop can have a large amount of phase noise due to divider 724, but can acquire lock and tune a frequency of an output signal from voltage-controlled oscillator 710 more rapidly than can the second loop. Once the first loop achieves lock, the second loop can take over and provide a low phase noise output.

When lock is initially being acquired, multiply-and-divide circuit 774 can provide an output signal to a first input of first phase detector 732 and to a first input of second phase detector 730. First phase detector 732 can provide an output signal that is filtered by lowpass filter 744 and amplified by amplifier 746. The output of amplifier 746 can be selected by multiplexer or switch 790 and provided to an R-C network or lowpass filter 792. The output of lowpass filter 792 can be received at a control input of voltage-controlled oscillator 710. The output of voltage-controlled oscillator 710 can be provided as an output signal having a frequency $F_{OUT}$. The output signal can be frequency divided by divider 724 and provided to a second input of first phase detector 732. First phase detector 732 can compare the phases of the incoming signals at its inputs and provide an output to lowpass filter 744 and determine whether lock has been achieved.

Lock can be detected in various ways. For example, when a dynamic amplitude of the output signal from first phase detector 732 falls below a threshold for a first duration, lock can be detected. Other methods of detecting lock can be used in these and other embodiments of the present invention.

After lock is detected, multiplexer or switch 790 can select the output of amplifier 742 and the second, lower phase noise loop can be active. The output of multiplexer or switch 790 can be provided to an R-C network or lowpass filter 792. The output of lowpass filter 792 can be received at a control input of voltage-controlled oscillator 710. The output of voltage-controlled oscillator 710 can be provided as an output signal having a frequency $F_{OUT}$. The output signal can be frequency converted by mixers 720 and 722 and provided to a second input of second phase detector 730. The output of second phase detector 730 can be provided to lowpass filter 740 and amplifier 742, which again can provide an output that is selected by multiplexer or switch 790.

Frequency synthesizer 700 can include a feedforward path including a number of frequency conversion elements. This feedforward path can receive a reference signal having a frequency $F_{REF}$. The reference signal can be provided by a crystal, digital-signal generator, oscillator, or other circuit or component. In this example, three serially-connected frequency conversion elements 750, 752, and 754 are shown, though in these and other embodiments of the present invention, one, two, four, or more serially-connected frequency conversion elements can be employed. Multiplexer 760 can receive two or more of the reference signal or outputs of elements 750, 752, and 754. Alternatively, multiplexer 760 can be omitted and an output of a final element in the series of elements can be utilized.

The output of multiplexer 760, or the output of a final element in the series of elements when multiplexer 760 is not used, can be received by multiply-and-divide circuits 770, 772, and 774. In this example, three multiply-and-divide circuits are shown, though in these and other embodiments of the present invention, one, two, four, or more multiply-and-divide circuits can be utilized.

Each multiply-and-divide circuit 770, 772, and 774, can selectively provide its input signal, a frequency-divided version of its input signal, or a frequency-multiplied version of its input signal, as an output. The output of multiply-and-divide circuit 770 can be used to determine a frequency conversion of mixer 720 in the feedback path of frequency synthesizer 700. The output of multiply-and-divide circuit 772 can be used to determine a frequency conversion of mixer 722 in the feedback path of frequency synthesizer 700. While two mixers are shown in the feedback path in this example, three, four, or more than four mixers can be used, and each mixer can receive an input from a corresponding multiply-and-divide circuit.

In frequency synthesizer 700, the frequency conversion provided by element 750, element 752, and element 754, can be adjusted by changing the divide ratios $K_0$, $K_1$, and $K_2$, respectively. The frequency conversion provided by the feedback path in frequency synthesizer 700 can be further adjusted by selecting from among the unity, divide, and multiply paths of multiply-and-divide circuits 770 and 772. Further adjustment can be made by adjusting the divide ratios $A_2$ and $A_1$ or multiply ratios $B_2$ and $B_1$ in each of the multiply-and-divide circuits 770 and 772, respectively. The frequency of the comparison signal received at the first input of first phase detector 732 and second phase detector 730 can be further adjusted by selecting from among the unity, divide, multiply paths of multiply-and-divide circuit 774. Further adjustments can be made by adjusting the divide ratio $A_0$ or multiply ratio $B_0$ in multiply-and-divide circuit 774. Frequency synthesizer 700 can include other circuits. For example, bandpass or other filters can be utilized at one or more outputs of mixer 720, mixer 722, element 750, element 752, element 754, or other locations to suppress one or more unwanted sidebands or other frequency components.

In these and other embodiments of the present invention, the fast acquisition provided by frequency synthesizer 700 can be used to provide a wide range of output signals. As before, it can be desirable to employ a variable-multiplier circuit to maintain high-frequency operation of much of the frequency synthesizer circuitry in order to mitigate the effects of thermal noise. An example is shown in the following figure.

Figure 8:
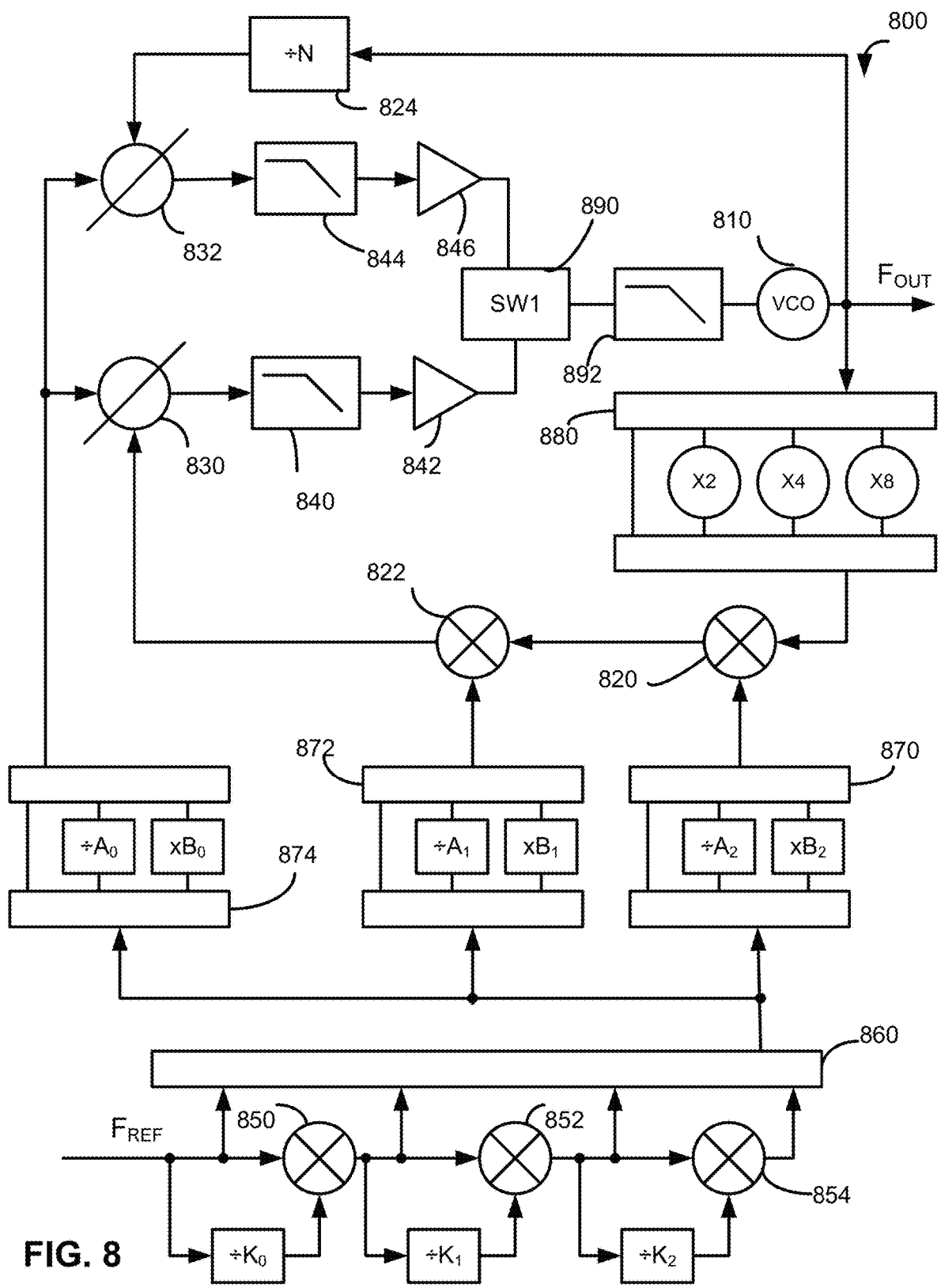
FIG. 8 illustrates a frequency synthesizer according to an embodiment of the present invention.

FIG. 8 illustrates a frequency synthesizer according to an embodiment of the present invention. Frequency synthesizer 800 can include a dual-loop configuration that can be the same or similar to the dual-loop configuration of frequency synthesizer 700 (shown in FIG. 7) where a first loop includes first phase detector 832 and divider 824, and a second loop that includes second phase detector 830 and mixers 820 and 822. The first loop can have a large amount of phase noise due to divider 824 but can acquire lock and tune a frequency of an output voltage provided by voltage-controlled oscillator 810 more rapidly than can the second loop. Once the first loop achieves lock, the second loop can take over and provide a low phase noise output.

When lock is initially being acquired, multiply-and-divide circuit 874 can provide an output signal to a first input of first phase detector 832 and to a first input of second phase detector 830. First phase detector 832 can provide an output signal that is filtered by lowpass filter 844 and amplified by amplifier 846. The output of amplifier 846 can be selected by multiplexer or switch 890 and provided to an R-C network or lowpass filter 892. The output of lowpass filter 892 can be received at a control input of voltage-controlled oscillator 810. The output of voltage-controlled oscillator 810 can be provided as an output signal having a frequency $F_{OUT}$. The output signal can be frequency divided by divider 824 and provided to a second input of first phase detector 832. First phase detector 832 can compare the phases of the incoming signals at its inputs and provide an output to lowpass filter 844 and determine whether lock has been achieved. Again, lock can be detected in various ways.

After lock is detected, multiplexer or switch 890 can select the output of amplifier 842 and the second, lower phase noise loop can be active. The output of multiplexer or switch 890 can be provided to an R-C network or lowpass filter 892. The output of lowpass filter 892 can be received at a control input of voltage-controlled oscillator 810. The output of voltage-controlled oscillator 810 can be provided as an output signal having a frequency Four. The output signal can be frequency converted by mixers 820 and 822 and provided to a second input of second phase detector 830. The output of second phase detector 830 can be provided to lowpass filter 840 and amplifier 842, which again can provide an output that is selected by multiplexer or switch 890.

Similar to frequency synthesizer 500 and frequency synthesizer 600, frequency synthesizer 800 can also utilize variable-multiplier circuit 880 to provide a signal to a feedback path that remains in a high-frequency range while the output signal from the voltage-controlled oscillator varies throughout a much wider range. Variable-multiplier circuit 880 can receive the voltage-controlled oscillator output signal having a frequency $F_{OUT}$ and provide one of the output signal or the output signal frequency-multiplied by one or more factors. Variable-multiplier circuit 880 can receive the output signal from the voltage-controlled oscillator 810 and increase its frequency $F_{OUT}$ to a higher range when necessary using one of the X2, X4, and X8 paths through variable-multiplier circuit 880. In one example, an output signal from voltage-controlled oscillator 810 can be varied over a range from 2 to 20 GHz, while the feedback path including mixer 820 can receive a signal having a frequency between 10 and 20 GHz. This can help to reduce thermal noise in the feedback path of frequency synthesizer 800.

Frequency synthesizer 800 can include a feedforward path including a number of frequency conversion elements. This feedforward path can receive a reference signal having a frequency $F_{REF}$. The reference signal can be provided by a crystal, digital-signal generator, oscillator, or other circuit or component. In this example, three serially-connected frequency conversion elements 850, 852, and 854 are shown, though in these and other embodiments of the present invention, one, two, four, or more serially-connected frequency conversion elements can be employed. Multiplexer 860 can receive two or more of the reference signal or outputs of elements 850, 852, and 854. Alternatively, multiplexer 860 can be omitted and an output of a final element in the series of elements can be utilized.

The output of multiplexer 860, or the output of a final element in the series of elements when multiplexer 860 is not used, can be received by multiply-and-divide circuits 870, 872, and 874. In this example, three multiply-and-divide circuits are shown, though in these and other embodiments of the present invention, one, two, four, or more multiply-and-divide circuits can be utilized.

Each multiply-and-divide circuit 870, 872, and 874, can selectively provide its input signal, a frequency-divided version of its input signal, or a frequency-multiplied version of its input signal, as an output. The output of multiply-and-divide circuit 870 can be used to determine a frequency conversion of mixer 820 in the feedback path of frequency synthesizer 800. The output of multiply-and-divide circuit 872 can be used to determine a frequency conversion of mixer 822 in the feedback path of frequency synthesizer 800. While two mixers are shown in the feedback path in this example, three, four, or more than four mixers can be used, and each mixer can receive an input from a corresponding multiply-and-divide circuit.

In frequency synthesizer 800, the frequency conversion provided by element 850, element 852, and element 854, can be adjusted by changing the divide ratios $K_0$, $K_1$, and $K_2$, respectively. The frequency conversion provided by the feedback path in frequency synthesizer 800 can be further adjusted by selecting from among the unity, divide, and multiply paths of multiply-and-divide circuits 870 and 872. Further adjustment can be made by adjusting the divide ratios $A_2$ and $A_1$ or multiply ratios $B_2$ and $B_1$ in each of the multiply-and-divide circuits 870 and 872, respectively. The frequency of the comparison signal received at the first input of second phase detector 830 can be further adjusted by selecting from among the unity, divide, multiply paths of multiply-and-divide circuit 874. Further adjustments can be made by adjusting the divide ratio $A_0$ or multiply ratio $B_0$ in multiply-and-divide circuit 874. Frequency synthesizer 800 can include other circuits. For example, bandpass or other filters can be utilized at one or more outputs of mixer 820, mixer 822, element 850, element 852, element 854, or other locations to suppress one or more unwanted sidebands or other frequency components.

While YIG oscillator 610 (shown in FIG. 6) is particularly suitable for providing a low phase noise output, the frequency synthesizer 600 can consume a certain amount of time to achieve bock. Accordingly, a dual-loop configuration that is similar to the dual-loop configurations in frequency synthesizer 700 and frequency synthesizer 800 can be used. An example is shown in the following figure.

Figure 9:
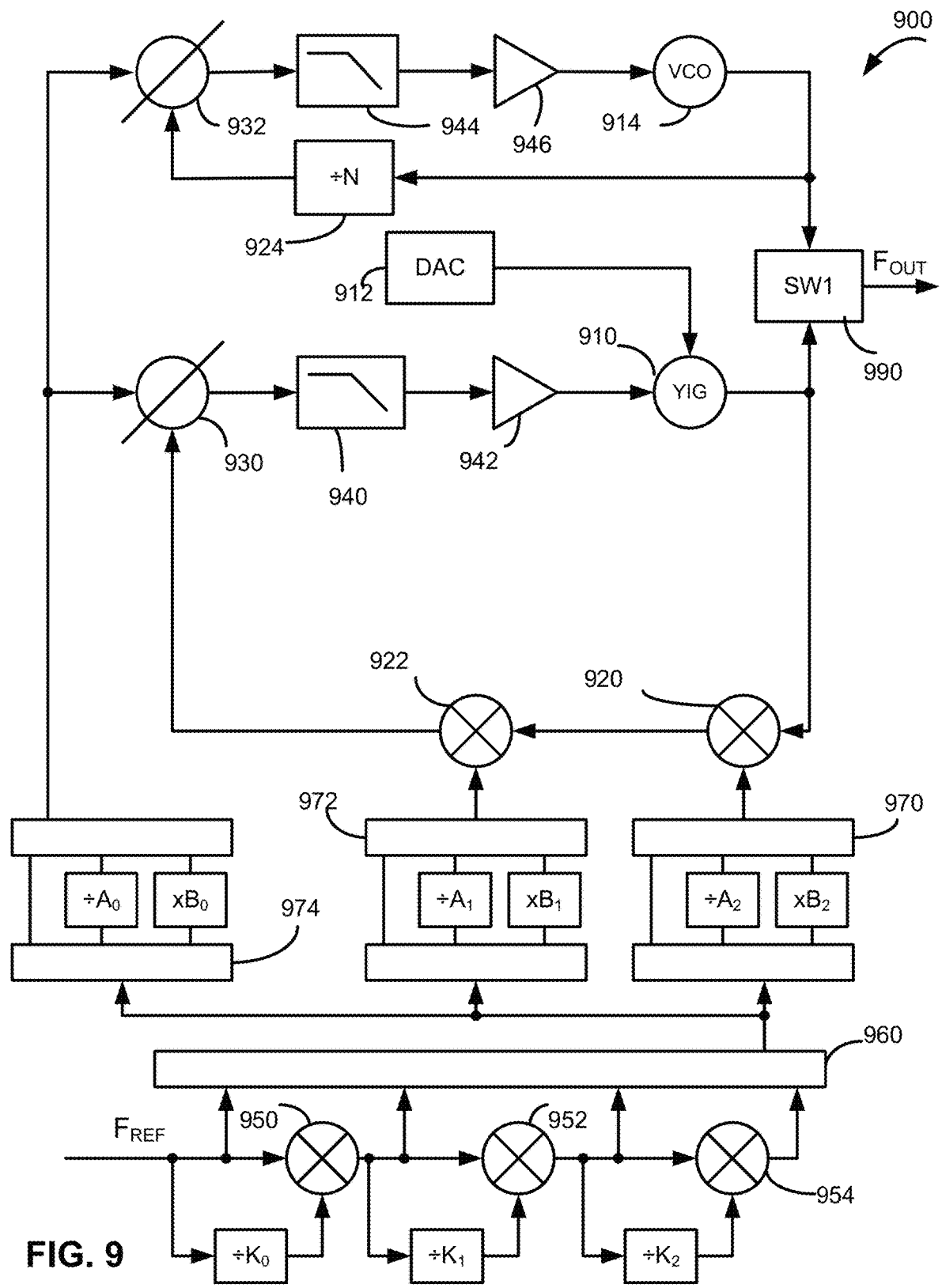
FIG. 9 illustrates a frequency synthesizer according to an embodiment of the present invention.

FIG. 9 illustrates a frequency synthesizer according to an embodiment of the present invention. Frequency synthesizer 900 can include a dual-loop configuration where a first loop includes first phase detector 932, a voltage-controlled oscillator 914, and divider 924, as well as a second loop that includes second phase detector 930, YIG oscillator 910, and mixers 920 and 922. The first loop can have a large amount of phase noise due to divider 924 but can acquire lock and tune a frequency of an output signal provided by YIG oscillator 910 more rapidly than can the second loop. Once the first loop achieves lock, the second loop including low phase noise YIG oscillator 910 can take over and provide a low phase noise output.

When lock is initially being acquired, multiply-and-divide circuit 974 can provide an output signal to a first input of first phase detector 932 and to a first input of second phase detector 930. First phase detector 932 can provide an output signal that is filtered by lowpass filter 944 and amplified by amplifier 946. The output of amplifier 946 can be received at a control input of voltage-controlled oscillator 914. The output of voltage-controlled oscillator 914 can be provided through multiplexer or switch 990 as an output signal having a frequency $F_{OUT}$. The output signal can be frequency divided by divider 924 and provided to a second input of first phase detector 932. First phase detector 932 can compare the phases of the incoming signals at its inputs and provide an output to lowpass filter 944 and determine whether lock has been achieved.

Lock can be detected in various ways. For example, when a dynamic amplitude of the output signal from first phase detector 932 falls below a threshold for a first duration, lock can be detected. Other methods of detecting lock can be used in these and other embodiments of the present invention.

After lock is detected, the control input of voltage-controlled oscillator 914 or other appropriate signal or signals can be used to select a setting for DAC 912. This setting can ensure that a frequency provided by YIG oscillator 910 can be close to a frequency provided by voltage-controlled oscillator 914. Multiplexer or switch 990 can select the output of output of YIG oscillator 910 as an output signal having a frequency $F_{OUT}$. The output signal can be frequency converted by mixers 920 and 922 and provided to a second input of second phase detector 930. The output of second phase detector 930 can be provided to lowpass filter 940 and amplifier 942, which can provide a fine-tuning signal to YIG oscillator 910.

Frequency synthesizer 900 can include a feedforward path including a number of frequency conversion elements. This feedforward path can receive a reference signal having a frequency $F_{REF}$. The reference signal can be provided by a crystal, digital-signal generator, oscillator, or other circuit or component. In this example, three serially-connected frequency conversion elements 950, 952, and 954 are shown, though in these and other embodiments of the present invention, one, two, four, or more serially-connected frequency conversion elements can be employed. Multiplexer 960 can receive two or more of the reference signal or outputs of elements 950, 952, and 954. Alternatively, multiplexer 960 can be omitted and an output of a final element in the series of elements can be utilized.

The output of multiplexer 960, or the output of a final element in the series of elements when multiplexer 960 is not used, can be received by multiply-and-divide circuits 970, 972, and 974. In this example, three multiply-and-divide circuits are shown, though in these and other embodiments of the present invention, one, two, four, or more multiply-and-divide circuits can be utilized.

Each multiply-and-divide circuit 970, 972, and 974, can selectively provide its input signal, a frequency-divided version of its input signal, or a frequency-multiplied version of its input signal, as an output. The output of multiply-and-divide circuit 970 can be used to determine a frequency conversion of mixer 920 in the feedback path of frequency synthesizer 900. The output of multiply-and-divide circuit 972 can be used to determine a frequency conversion of mixer 922 in the feedback path of frequency synthesizer 900. While two mixers are shown in the feedback path in this example, three, four, or more than four mixers can be used, and each mixer can receive an input from a corresponding multiply-and-divide circuit.

In frequency synthesizer 900, the frequency conversion provided by element 950, element 952, and element 954, can be adjusted by changing the divide ratios $K_0$, $K_1$, and $K_2$, respectively. The frequency conversion provided by the feedback path in frequency synthesizer 900 can be further adjusted by selecting from among the unity, divide, and multiply paths of multiply-and-divide circuits 970 and 972. Further adjustment can be made by adjusting the divide ratios $A_2$ and $A_1$ or multiply ratios $B_2$ and $B_1$ in each of the multiply-and-divide circuits 970 and 972, respectively. The frequency of the comparison signal received at the first input of second phase detector 930 can be further adjusted by selecting from among the unity, divide, multiply paths of multiply-and-divide circuit 974. Further adjustments can be made by adjusting the divide ratio $A_0$ or multiply ratio $B_0$ in multiply-and-divide circuit 974. Frequency synthesizer 900 can include other circuits. For example, bandpass or other filters can be utilized at one or more outputs of mixer 920, mixer 922, element 950, element 952, element 954, or other locations to suppress one or more unwanted sidebands or other frequency components.

In these and other embodiments of the present invention, the second loop in the dual-loop configuration can include a variable-multiplier circuit such that its feedback path can operate at higher frequencies away from thermal noise. The dual loop can further include a YIG oscillator in the second, low phase noise loop in order to further reduce phase noise. An example is shown in the following figure.

Figure 10:
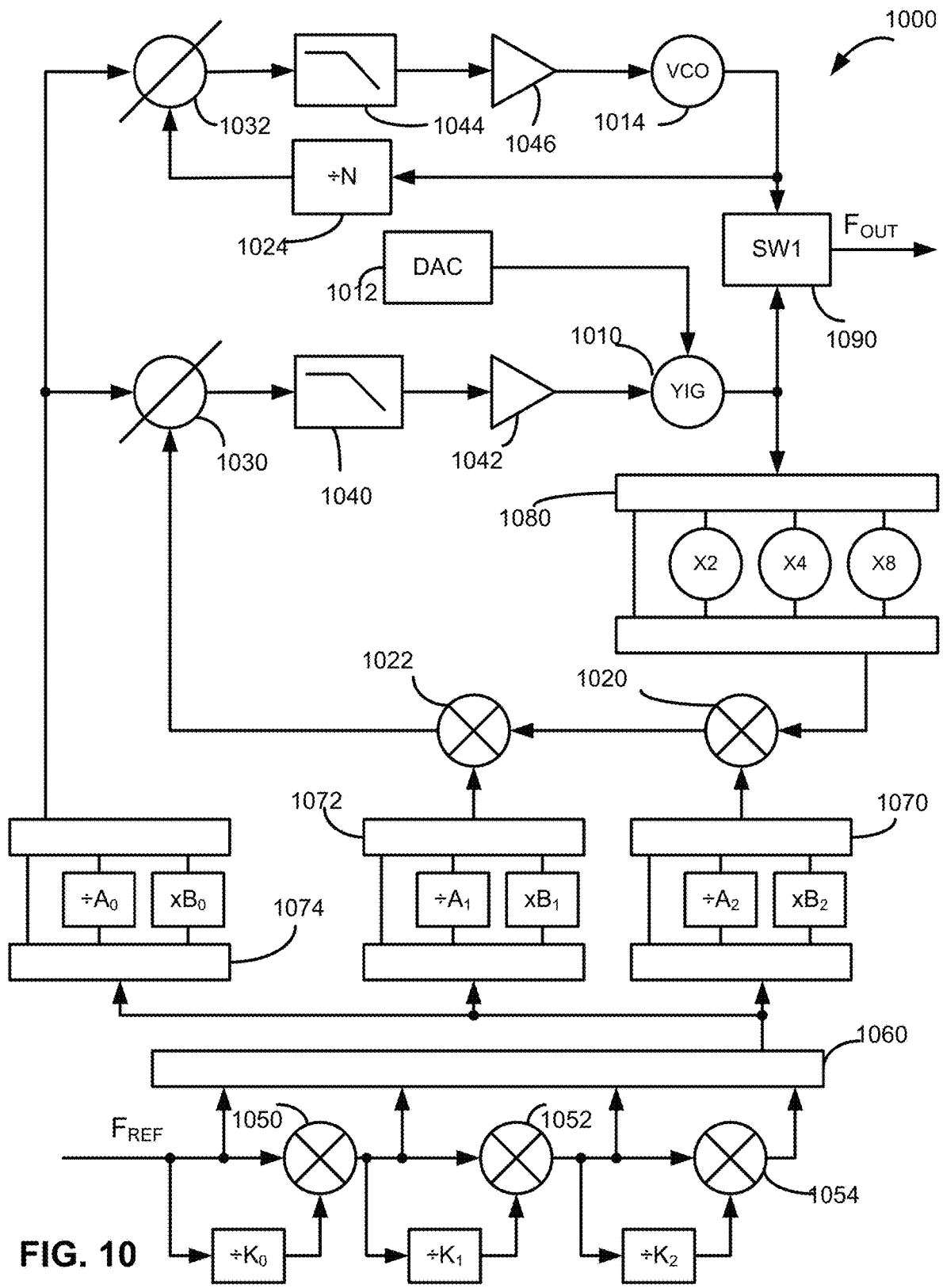
FIG. 10 illustrates a frequency synthesizer according to an embodiment of the present invention.

FIG. 10 illustrates a frequency synthesizer according to an embodiment of the present invention. Frequency synthesizer 1000 can include a dual-loop configuration where a first loop includes first phase detector 1032, voltage-controlled oscillator 1014, and divider 1024, as well as a second loop that includes second phase detector 1030, YIG oscillator 1010, variable-multiplier circuit 1080, and mixers 1020 and 1022. The first loop can have a large amount of phase noise due to divider 1024 but can acquire lock and tune a frequency of an output voltage provided by YIG oscillator 1010 more rapidly than can the second loop. Once the first loop achieves lock, the second loop including low phase noise YIG oscillator 1010 can take over and provide a low phase noise output.

Similar to frequency synthesizer 500, frequency synthesizer 600, and frequency synthesizer 800, frequency synthesizer 1000 can also utilize variable-multiplier circuit 1080 to provide a signal to a feedback path that remains in a high-frequency range while the output signal from the voltage-controlled oscillator varies throughout a much wider range. Variable-multiplier circuit 1080 can receive the voltage-controlled oscillator output signal having a frequency $F_{OUT}$ and provide one of the output signal or the output signal frequency-multiplied by one or more factors. Variable-multiplier circuit 1080 can receive the output signal from the YIG oscillator 1010 and increase its frequency $F_{OUT}$ to a higher range when necessary using one of the X2, X4, and X8 paths through variable-multiplier circuit 1080. In one example, an output signal from YIG oscillator 1010 can be varied over a range from 2 to 20 GHz, while the feedback path including mixer 1020 can receive a signal having a frequency between 10 and 20 GHz. This can help to reduce thermal noise in the feedback path of frequency synthesizer 1000.

When lock is initially being acquired, multiply-and-divide circuit 1074 can provide an output signal to a first input of first phase detector 1032 and to a first input of second phase detector 1030. First phase detector 1032 can provide an output signal that is filtered by lowpass filter 1044 and amplified by amplifier 1046. The output of amplifier 1046 can be received at a control input of voltage-controlled oscillator 1014. The output of voltage-controlled oscillator 1014 can be provided through multiplexer or switch 1090 as an output signal having a frequency $F_{OUT}$. The output signal can be frequency divided by divider 1024 and provided to a second input of first phase detector 1032. First phase detector 1032 can compare the phases of the incoming signals at its inputs and provide an output to lowpass filter 1044 and determine whether lock has been achieved.

Lock can be detected in various ways. For example, when a dynamic amplitude of the output signal from first phase detector 1032 falls below a threshold for a first duration, lock can be detected. Other methods of detecting lock can be used in these and other embodiments of the present invention.

After lock is detected, the control input of voltage-controlled oscillator 1014 or other appropriate signal or signals can be used to select a setting for DAC 1012. This setting can ensure that a frequency provided by YIG oscillator 1010 can be close to a frequency provided by voltage-controlled oscillator 1014. Multiplexer or switch 1090 can select the output of output of YIG oscillator 1010 as an output signal having a frequency $F_{OUT}$. The output signal can be frequency converted by mixers 1020 and 1022 and provided to a second input of second phase detector 1030. The output of second phase detector 1030 can be provided to lowpass filter 1040 and amplifier 1042, which can provide a fine-tuning signal to YIG oscillator 1010.

Frequency synthesizer 1000 can include a feedforward path including a number of frequency conversion elements. This feedforward path can receive a reference signal having a frequency $F_{REF}$. The reference signal can be provided by a crystal, digital-signal generator, oscillator, or other circuit or component. In this example, three serially-connected frequency conversion elements 1050, 1052, and 1054 are shown, though in these and other embodiments of the present invention, one, two, four, or more serially-connected frequency conversion elements can be employed. Multiplexer 1060 can receive two or more of the reference signal or outputs of elements 1050, 1052, and 1054. Alternatively, multiplexer 1060 can be omitted and an output of a final element in the series of elements can be utilized.

The output of multiplexer 1060, or the output of a final element in the series of elements when multiplexer 1060 is not used, can be received by multiply-and-divide circuits 1070, 1072, and 1074. In this example, three multiply-and-divide circuits are shown, though in these and other embodiments of the present invention, one, two, four, or more multiply-and-divide circuits can be utilized.

Each multiply-and-divide circuit 1070, 1072, and 1074, can selectively provide its input signal, a frequency-divided version of its input signal, or a frequency-multiplied version of its input signal, as an output. The output of multiply-and-divide circuit 1070 can be used to determine a frequency conversion of mixer 1020 in the feedback path of frequency synthesizer 1000. The output of multiply-and-divide circuit 1072 can be used to determine a frequency conversion of mixer 1022 in the feedback path of frequency synthesizer 1000. While two mixers are shown in the feedback path in this example, three, four, or more than four mixers can be used, and each mixer can receive an input from a corresponding multiply-and-divide circuit.

In frequency synthesizer 1000, the frequency conversion provided by element 1050, element 1052, and element 1054, can be adjusted by changing the divide ratios $K_0$, $K_1$, and $K_2$, respectively. The frequency conversion provided by the feedback path in frequency synthesizer 1000 can be further adjusted by selecting from among the unity, divide, and multiply paths of multiply-and-divide circuits 1070 and 1072. Further adjustment can be made by adjusting the divide ratios $A_2$ and $A_1$ or multiply ratios $B_2$ and $B_1$ in each of the multiply-and-divide circuits 1070 and 1072, respectively. The frequency of the comparison signal received at the first input of second phase detector 1030 can be further adjusted by selecting from among the unity, divide, multiply paths of multiply-and-divide circuit 1074. Further adjustments can be made by adjusting the divide ratio $A_0$ or multiply ratio $B_0$ in multiply-and-divide circuit 1074. Frequency synthesizer 1000 can include other circuits. For example, bandpass or other filters can be utilized at one or more outputs of mixer 1020, mixer 1022, element 1050, element 1052, element 1054, or other locations to suppress one or more unwanted sidebands or other frequency components.

The circuits in the above frequency synthesizers and phase-locked loops can be formed in various ways. For example, they can be formed on one or more integrated circuits, they can include one or more hybrid packages, they can include one or more discrete components, or any combination thereof. Typically, the YIG oscillators can be a separate components housed in a module or other package.

The above description of embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. Thus, it will be appreciated that the invention is intended to cover all modifications and equivalents within the scope of the following claims.

What is claimed is:

1. A frequency synthesizer comprising:
   a phase detector having a first input, a second input, and an output;
   a voltage-controlled oscillator having an input coupled to the output of the phase detector, and an output;
   a feedforward path having an input to receive a reference signal and an output coupled to the first input of the phase detector; and
   a feedback path having an input coupled to the output of the voltage-controlled oscillator and an output coupled to the second input of the phase detector, the feedback path comprising a variable-multiplier circuit having an input coupled to the input of the feedback path, and a first mixer having an output coupled to the output of the feedback path,
   wherein the feedforward path comprises a first element, the first element having an input coupled to a first input of a second mixer and an input of a first divider, and an output coupled to an output of the second mixer, where an output of the first divider is coupled to a second input of the second mixer.

2. The frequency synthesizer of claim 1 wherein the variable-multiplier circuit comprises a first selection circuit to select one of a frequency doubler, a series of two frequency doublers, a series of three frequency doublers, or a bypass path.

3. The frequency synthesizer of claim 1 wherein the feedforward path further comprises a first selection circuit having an input coupled to an output of the first element and an output coupled to a first input of the first mixer, the first selection circuit to select one of a frequency divider, a frequency multiplier, or a bypass path.

4. The frequency synthesizer of claim 3 wherein the voltage-controlled oscillator comprises a yttrium-iron-garnet oscillator.

5. The frequency synthesizer of claim 1 wherein the variable-multiplier circuit is configurable to multiply a frequency of a signal at its input by a first factor, a second factor, or a third factor and to provide the frequency multiplied signal to the first mixer.

6. A frequency synthesizer comprising:
   a first phase detector having a first input, a second input, and an output;
   a second phase detector having a first input, a second input, and an output;
   a multiplexer having a first input coupled to the output of the first phase detector, a second input coupled to the output of the second phase detector, and an output;
   a voltage-controlled oscillator having an input coupled to the output of the multiplexer, and an output;
   a first feedback path comprising a first divider having an input coupled to the output of the voltage-controlled oscillator and an output coupled to the second input of the first phase detector;
   a second feedback path having an input coupled to the output of the voltage-controlled oscillator and an output coupled to the second input of the second phase detector, the second feedback path comprising a first mixer having an output coupled to the output of the second feedback path; and
   a feedforward path having an input to receive a reference signal and an output coupled to the first input of the first phase detector and the first input of the second phase detector, wherein the feedforward path comprises a first element, the first element having an input coupled to a first input of a second mixer and an input of a second divider, and an output coupled to an output of the second mixer, where an output of the second divider is coupled to a second input of the second mixer.

7. The frequency synthesizer of claim 6 wherein the feedforward path further comprises a first selection circuit having an input coupled to an output of the first element and an output coupled to a first input of the first mixer, the first selection circuit for selecting one of a frequency divider, a frequency multiplier, or a bypass path.

8. The frequency synthesizer of claim 6 wherein the second feedback path further comprises a variable-multiplier circuit having an input coupled to the input of the second feedback path.

9. The frequency synthesizer of claim 8 wherein the variable-multiplier circuit comprises a first selection circuit to select one of a frequency doubler, a series of two frequency doublers, a series of three frequency doublers, or a bypass path.

10. The frequency synthesizer of claim 8 wherein the variable-multiplier circuit is configurable to multiply a frequency of a signal at its input by a first factor, a second factor, or a third factor and to provide the frequency multiplied signal to a third mixer in the second feedback path.

11. A frequency synthesizer comprising:
a first phase detector having a first input, a second input, and an output;
a second phase detector having a first input, a second input, and an output;
a multiplexer having a first input coupled to the output of the first phase detector, a second input coupled to the output of the second phase detector, and an output;
a voltage-controlled oscillator having an input coupled to the output of the multiplexer, and an output;
a first feedback path comprising a first divider having an input coupled to the output of the voltage-controlled oscillator and an output coupled to the second input of the first phase detector;
a second feedback path having an input coupled to the output of the voltage-controlled oscillator and an output coupled to the second input of the second phase detector, the second feedback path comprising a first mixer and a variable-multiplier circuit having an input coupled to the input of the second feedback path, wherein the variable-multiplier circuit is configurable to multiply a frequency of a signal at its input by a first factor, a second factor, or a third factor and to provide the frequency multiplied signal to a second input of the first mixer, the first mixer having an output coupled to the output of the second feedback path; and
a feedforward path having an input to receive a reference signal and an output coupled to the first input of the first phase detector and the first input of the second phase detector.

12. The frequency synthesizer of claim 11 wherein the feedforward path comprises a first element, the first element having an input coupled to a first input of a second mixer and an input of a second divider, and an output coupled to an output of the second mixer, where an output of the second divider is coupled to a second input of the second mixer.

13. The frequency synthesizer of claim 12 wherein the feedforward path further comprises a first selection circuit having an input coupled to an output of the first element and an output coupled to a first input of the first mixer, the first selection circuit for selecting one of a frequency divider, a frequency multiplier, or a bypass path.

14. The frequency synthesizer of claim 13 wherein the feedforward path further comprises a second selection circuit having an input coupled to an output of the first element and an output coupled to the first input of the first phase detector and the first input of the second phase detector, the second selection circuit for selecting one of a frequency divider, a frequency multiplier, or a bypass path.

15. The frequency synthesizer of claim 14 wherein the variable-multiplier circuit comprises a third selection circuit to select one of a frequency doubler, a series of two frequency doublers, a series of three frequency doublers, or a bypass path.

16. The frequency synthesizer of claim 11 wherein the feedforward path further comprises a first selection circuit having an output coupled to a first input of the first mixer, the first selection circuit for selecting one of a frequency divider, a frequency multiplier, or a bypass path.

17. A frequency synthesizer comprising:
a first phase detector having a first input, a second input, and an output;
a second phase detector having a first input, a second input, and an output;
a multiplexer having a first input coupled to the output of the first phase detector, a second input coupled to the output of the second phase detector, and an output;
a voltage-controlled oscillator having an input coupled to the output of the multiplexer, and an output;
a first divider having an input coupled to the output of the voltage-controlled oscillator and an output coupled to the second input of the first phase detector;
a variable-multiplier circuit having an input coupled to the output of the voltage-controlled oscillator;
a first mixer having a first input coupled to an output of the variable-multiplier circuit and an output coupled to the second input of the second phase detector;
a first element having an input to receive a reference signal; and
a first selection circuit having an input coupled to the output of the first element and an output coupled to the first input of the first phase detector and the first input of the second phase detector, the first selection circuit to select one of a frequency divider, a frequency multiplier, or a bypass path.

18. The frequency synthesizer of claim 17 wherein the variable-multiplier circuit comprises a second selection circuit to select one of a frequency doubler, a series of two frequency doublers, a series of three frequency doublers, or a bypass path.

19. The frequency synthesizer of claim 17 wherein the first element includes an input coupled to a first input of a second mixer and an input of a second divider, and an output coupled to an output of the second mixer, where an output of the second divider is coupled to a second input of the second mixer.

20. The frequency synthesizer of claim 19 further comprising a third selection circuit having an input coupled to an output of the first element and an output coupled to a second input of the first mixer, the third selection circuit to select one of a frequency divider, a frequency multiplier, or a bypass path.

* * * * *